US010872966B1

(12) United States Patent
Cheng

(10) Patent No.: US 10,872,966 B1
(45) Date of Patent: Dec. 22, 2020

(54) STORAGE MEMORY DEVICE

(71) Applicant: National Taiwan Normal University, Taipei (TW)

(72) Inventor: Chun-Hu Cheng, Taipei (TW)

(73) Assignee: NATIONAL TAIWAN NORMAL UNIVERSITY, Taipei (TW)

( * ) Notice: Subject to any disclaimer, the term of this patent is extended or adjusted under 35 U.S.C. 154(b) by 0 days.

(21) Appl. No.: 16/676,669

(22) Filed: Nov. 7, 2019

(30) Foreign Application Priority Data

Jul. 2, 2019 (TW) ............................. 108123213 A
Jul. 2, 2019 (TW) ............................. 108123214 A

(51) Int. Cl.
*H01L 29/51* (2006.01)
*H01L 27/11597* (2017.01)
*H01L 29/78* (2006.01)
*H01L 29/423* (2006.01)

(52) U.S. Cl.
CPC ...... *H01L 29/516* (2013.01); *H01L 27/11597* (2013.01); *H01L 29/4234* (2013.01); *H01L 29/78391* (2014.09)

(58) Field of Classification Search
CPC ............. H01L 29/516; H01L 27/11597; H01L 29/4234; H01L 29/78391
USPC ....................................................... 257/295
See application file for complete search history.

(56) References Cited

U.S. PATENT DOCUMENTS

2015/0214322 A1* 7/2015 Mueller ............... H01L 21/0228
257/295
2015/0340372 A1* 11/2015 Pandey ............. H01L 29/78391
257/295
2015/0357429 A1* 12/2015 Dubourdieu .......... H01L 29/516
257/295
2015/0380511 A1* 12/2015 Irsigler ................. H01L 29/513
257/295
2016/0035856 A1* 2/2016 van Bentum ....... H01L 29/6684
257/295
2016/0049302 A1* 2/2016 Grass .............. H01L 21/823857
257/369

(Continued)

FOREIGN PATENT DOCUMENTS

TW      201818507 A      5/2018
TW      201916118 A      4/2019
TW      201926547 A      7/2019

OTHER PUBLICATIONS

Office Action issued to Taiwanese counterpart application No. 108123214 by the TIPO dated May 8, 2020.

*Primary Examiner* — Sheikh Maruf
(74) *Attorney, Agent, or Firm* — Birch, Stewart, Kolasch & Birch LLP

(57) ABSTRACT

A storage memory device includes a vertical field effect transistor including a semiconductor substrate; a pillar extending upwardly from the substrate and containing a source, a drain, and a channel disposed therebetween; a first insulating layer surrounding the channel; a stacked structure surrounding the first insulating layer; and a gate unit. The stacked structure includes a charge trapping layer and a composite element. The composite element includes a ferroelectric layer made of a doped hafnium oxide-based material that has a predominantly orthorhombic phase and exhibits a negative capacitance; and an antiferroelectric layer made of a zirconium oxide-based material that has a predominantly tetragonal phase.

15 Claims, 6 Drawing Sheets

(56) References Cited

U.S. PATENT DOCUMENTS

| | | | |
|---|---|---|---|
| 2016/0064228 A1* | 3/2016 | van Bentum | H01L 27/11592 257/295 |
| 2016/0064510 A1* | 3/2016 | Mueller | H01L 29/78391 257/295 |
| 2016/0071947 A1* | 3/2016 | Wiatr | H01L 29/66545 257/295 |
| 2016/0099354 A1* | 4/2016 | Ramaswamy | H01L 29/513 257/295 |
| 2016/0111549 A1* | 4/2016 | Baars | H01L 29/40111 257/295 |
| 2016/0118404 A1* | 4/2016 | Peng | H01L 27/1159 257/295 |
| 2016/0181259 A1* | 6/2016 | Van Houdt | H01L 29/78391 365/145 |

* cited by examiner

US 10,872,966 B1

STORAGE MEMORY DEVICE

CROSS-REFERENCE TO RELATED APPLICATION

This application claims priority of Taiwanese Invention Patent Application Nos. 108123213 and 108123214, filed on Jul. 2, 2019.

FIELD

The disclosure relates to a memory device, and more particularly to a storage memory device.

BACKGROUND

A conventional non-volatile memory device includes a substrate, an insulating layer formed on a portion of the substrate, a source and a drain formed on the substrate and on two opposite sides of the insulating layer, a charge trapping layer formed on the insulating layer, an insulating barrier formed on the charge trapping layer, and a gate formed on the insulating barrier. To effectively reduce the operating voltage of the memory device, a high dielectric constant (high-k) oxide, such as silicon oxide, hafnium oxide and aluminum oxide, is commonly used in manufacturing the insulating barrier. However, the memory device including the high-k oxide would have higher operating voltage for writing/erasing operation, as well as slower writing/erasing speed (about 100 μs to 1 ms), which lead to poor operating endurance.

U.S. Patent Application Publication No. 2018/0182769 A1 discloses a flash memory that includes a vertical field effect transistor having a stacked structure, which has a ferroelectric layer exhibiting a negative capacitance and a charge trapping layer. With such stacked structure, the flash memory has improved properties, such as reduced leakage current, faster operating speed, lower subthreshold swing, and increased reading and writing speed (about 800 ns).

Despite the rapid development of memory device, there is still a need for further improvement of the operating speed and the operating endurance of the memory device.

SUMMARY

Therefore, an object of the disclosure is to provide a storage memory device having lower operating voltage for writing/erasing and faster operating speed.

According to this disclosure, the storage memory device includes a vertical field effect transistor including a semiconductor substrate, a pillar, a first insulating layer, a stacked structure and a gate unit. The pillar is disposed on the semiconductor substrate and extends away from the semiconductor substrate in an extension direction. The pillar includes a source and a drain that are disposed at two opposite end portions of the pillar, and a channel that is disposed between and connected with the source and the drain. The first insulating layer surrounds a portion of the channel of the pillar. The stacked structure is disposed on and surrounds the first insulating layer opposite to the pillar, and includes a charge trapping layer and a composite element that has a ferroelectric layer and an antiferroelectric layer. The ferroelectric layer is made of a doped hafnium oxide-based material that has a predominantly orthorhombic phase and that exhibits a negative capacitance. The antiferroelectric layer is made of a zirconium oxide-based material that has a predominantly tetragonal phase. The gate unit surrounds a portion of the stacked structure opposite to the first insulating layer, and includes at least one gate.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
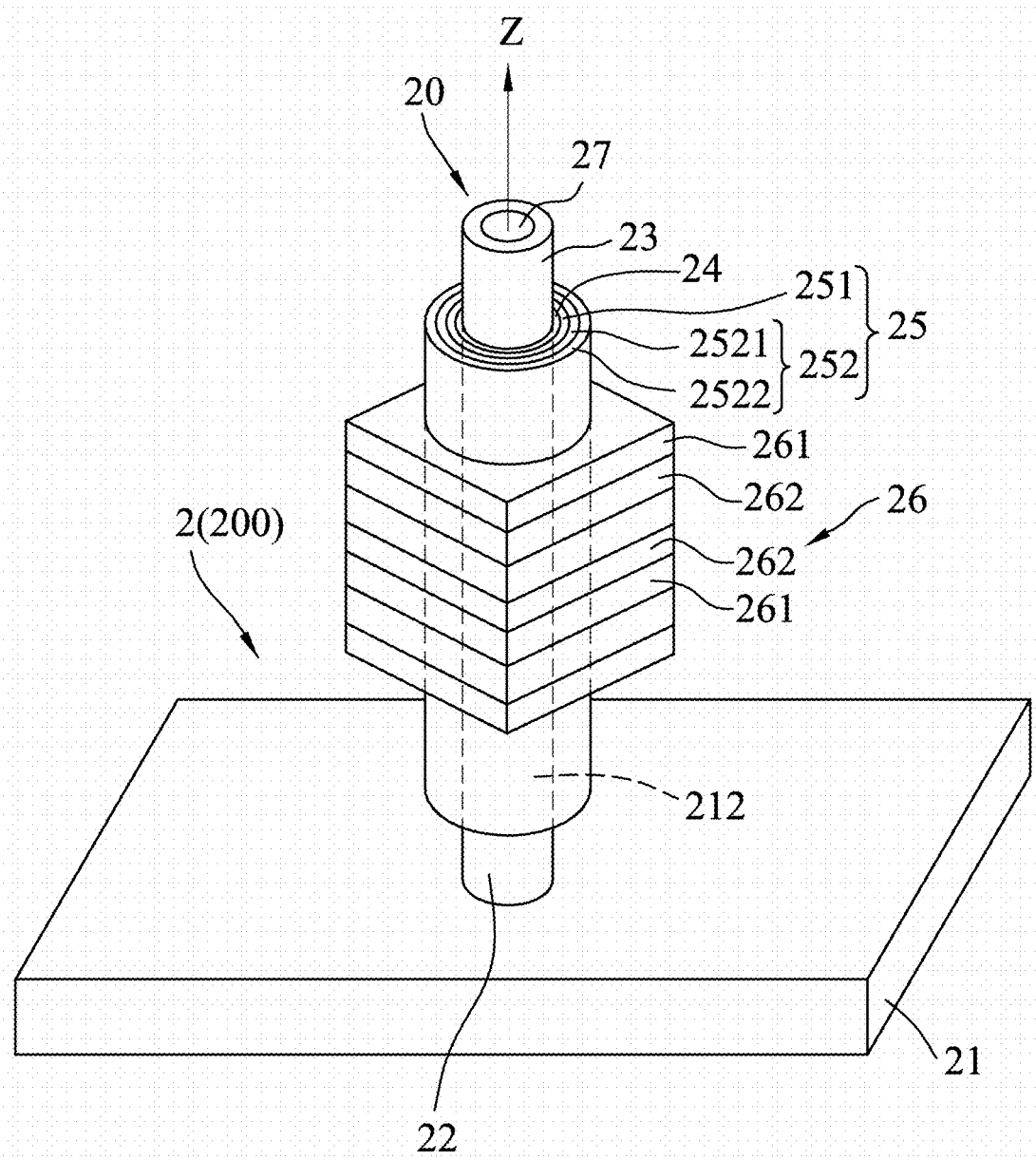
FIG. 1 is a schematic perspective view illustrating a vertical field effect transistor of an embodiment of a storage memory device according to the disclosure.
Figure 2:
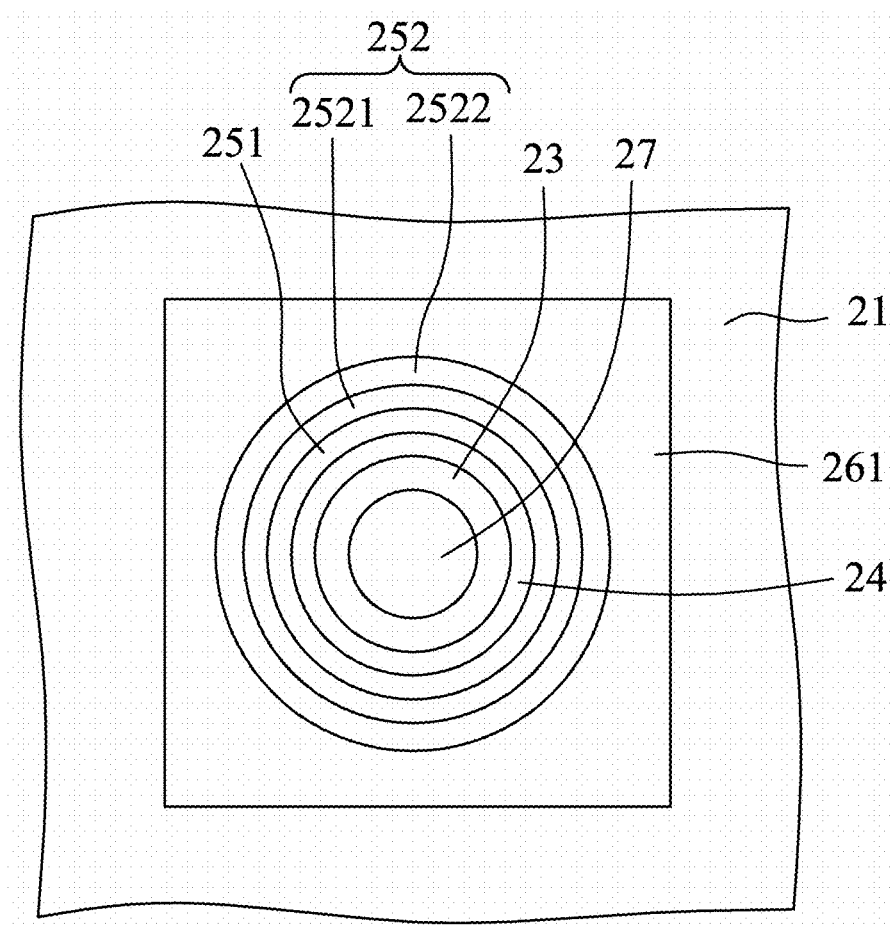
FIG. 2 is a top view of the vertical field effect transistor of the embodiment.

Before the disclosure is described in greater detail, it should be noted that where considered appropriate, reference numerals or terminal portions of reference numerals have been repeated among the figures to indicate corresponding or analogous elements, which may optionally have similar characteristics.

An embodiment of the storage memory device 2 according to the disclosure includes a plurality of storage cells. Each of the storage cells includes a vertical field effect transistor 200 (see FIG. 1) and at least one capacitor (not shown). FIG. 1 only illustrates the vertical field effect transistor 200 of one of the storage cells of the storage memory device 2.

Referring to FIG. 1, the vertical field effect transistor 200 includes a pillar 20, a semiconductor substrate 21, a first insulating layer 24, a stacked structure 25, a gate unit 26 and an insulating body 27.

The pillar 20 is disposed on the semiconductor substrate 21 and extends away from the semiconductor substrate 21 in an extension direction (Z). According to this disclosure, the pillar 20 may be configured as any suitable shape, such as a cylinder and a prism (e.g., triangular, rectangular, pentagonal, or polygonal prism). In this embodiment, the pillar 20 is configured as a cylinder.

The insulating body 27 is also disposed on the semiconductor substrate 21 and extends away from the semiconductor substrate 21 in the extension direction (Z). The pillar 20 surrounds and is formed on the insulating body 27. In one aspect, the insulating body 27 may be omitted from the field effect transistor 200, and the pillar 20 may be a hollow or solid structure.

The pillar 20 includes a source 22 and a drain 23 that are disposed at two opposite end portions of the pillar 20, and a channel 212 that is disposed between and connected with the source 22 and the drain 23. The first insulating layer 24 surrounds a portion of the channel 212 of the pillar 20 to expose the source 22 and the drain 23.

The stacked structure 25 is disposed on and surrounds the first insulating layer 24 opposite to the pillar 20, and includes a charge trapping layer 251 and a composite element 252.

The gate unit 26 surrounds a portion of the stacked structure 25 opposite to the first insulating layer 24, and may include at least one gate 261. In this embodiment, the gate unit 26 includes a plurality of gates 261 and a plurality of gate insulators 262 which are alternately stacked along the extension direction (Z). The gate unit 26 may be configured as any suitable shape, such as a rectangular prism as shown in FIG. 1, but is not limited thereto.

Specifically, the semiconductor substrate 21 may be made of monocrystalline silicon, polycrystalline silicon, germanium, or other suitable semiconductor materials. Each of the first insulating layer 24 and the insulating body 27 may be formed by a monolayer or multilayers of insulating material stacked together. Examples of the insulating material may include silicon oxide, aluminum oxide, etc.

The charge trapping layer 251 of the stacked structure 25 is made of a conductor, a semiconductor or an insulating material having a high dielectric constant. The insulating material may be selected from silicon nitride ($SiN_x$), silicon carbide (SiC), a high dielectric constant (high-k) oxide having a non-orthorhombic phase (predominant crystalline phases of the high-k oxide are generally monoclinic or tetragonal phases), and combinations thereof. The high-k oxide is selected from zirconium oxide ($ZrO_2$), hafnium oxide ($HfO_2$), aluminum oxide ($Al_2O_3$), titanium oxide ($TiO_2$), tantalum oxide (TaO), zirconium oxynitride (ZrON), hafnium oxynitride (HfON), silicon oxynitride (SiON), aluminum oxynitride (AlON), titanium oxynitride (TiON), tantalum oxynitride (TaON), hafnium silicon oxide (HfSiO), zirconium silicon oxide (ZrSiO), and combinations thereof.

The composite element 252 of the stacked structure has a ferroelectric layer 2521 and an antiferroelectric layer 2522. The ferroelectric layer 2521 is made of a doped hafnium oxide-based material that has a predominantly orthorhombic phase and that exhibits a negative capacitance. It is noted that a negative capacitance is observed in the doped hafnium oxide-based material having a predominantly orthorhombic phase. Examples of the doped hafnium oxide-based material may include, but are not limited to, aluminum (Al)-doped hafnium oxide ($HfAlO_x$), silicon (Si)-doped hafnium oxide ($HfSiO_x$), strontium (Sr)-doped hafnium oxide ($HfSrO_x$), zirconium (Zr)-doped hafnium oxide ($HfZrO_x$), lanthanum (La)-doped hafnium oxide ($HfLaO_x$), yttrium (Y)-doped hafnium oxide ($HfYO_x$), gadolinium (Gd)-doped hafnium oxide ($HfGdO_x$), and combinations thereof.

When the doped hafnium oxide-based material is Al-doped hafnium oxide, Al is present in an amount ranging from 2 mol % to 10 mol % based on a total molar amount of the Al-doped hafnium oxide. When the doped hafnium oxide-based material is Si-doped hafnium oxide, Si is present in an amount ranging from 2 mol % to 10 mol % based on a total molar amount of the Si-doped hafnium oxide. When the doped hafnium oxide-based material is Sr-doped hafnium oxide, Sr is present in an amount ranging from 2 mol % to 15 mol % based on a total molar amount of the Sr-doped hafnium oxide. When the doped hafnium oxide-based material is Zr-doped hafnium oxide, Zr is present in an amount ranging from 1 mol % to 50 mol % based on a total molar amount of the Zr-doped hafnium oxide. When the doped hafnium oxide-based material is La-doped hafnium oxide, La is present in an amount ranging from 2 mol % to 15 mol % based on a total molar amount of the La-doped hafnium oxide. When the doped hafnium oxide-based material is Y-doped hafnium oxide, Y is present in an amount ranging from 2 mol % to 15 mol % based on a total molar amount of the Y-doped hafnium oxide. When the doped hafnium oxide-based material is Gd-doped hafnium oxide, Gd is present in an amount ranging from 2 mol % to 15 mol % based on a total molar amount of the Gd-doped hafnium oxide.

The antiferroelectric layer 2522 is made of a zirconium oxide-based material having a predominantly tetragonal phase. The zirconium oxide-based material may include undoped zirconium oxide ($ZrO_2$), doped zirconium oxide, and the combination thereof. The doped zirconium oxide may be doped with a dopant, such as silicon (i.e., the doped zirconium oxide being $ZrSiO_x$), aluminum (i.e., the doped zirconium oxide being $ZrAlO_x$), germanium (i.e., the doped zirconium oxide being $ZrGeO_x$), yttrium (i.e., the doped zirconium oxide being $ZrYO_x$), hafnium (i.e., the doped zirconium oxide being $ZrHfO_x$), and nitrogen (i.e., the doped zirconium oxide being $ZrNO_x$). The dopant may be present in an amount greater than 0 mol % and not greater than 50 mol % based on a total molar amount of the doped zirconium oxide. It is worth mentioning that the zirconium oxide-based material may include a combination of more than one of the doped zirconium oxides as mentioned above. For example, the zirconium oxide-based material may include $ZrSiO_x$ and $ZrAlO_x$.

It is noted that the doping concentration of the aforementioned doped hafnium oxide-based material and doped zirconium oxide may be adjusted according to the dopant properties and the crystalline phases of the ferroelectric and antiferroelectric layers to be formed.

The gate 261 may be made of a metal or semiconductor material. In some aspects, the metal material may be metal nitride or metal carbide. Examples of the metal nitride or metal carbide may include, but are not limited to, tantalum nitride (TaN), tungsten nitride (WN), titanium nitride (TiN), tantalum carbide (TaC), titanium aluminum carbide (TiAlC), titanium carbide (TiC), and tantalum aluminum carbide (TaAlC). The gate insulator 262 may be made of a material, such as silicon oxide or aluminum oxide.

In this embodiment, the charge trapping layer 251 is formed on the first insulating layer 24, and the composite element 252 is formed on the charge trapping layer 251. In one aspect, the composite element 252 may be formed on the first insulating layer 24, and the charge trapping layer 251 is formed on the composite element 252.

In addition, in this embodiment, the ferroelectric layer 2521 is formed on the charge trapping layer 251, and the antiferroelectric layer 2522 is formed on the ferroelectric layer 2521. In other aspects, the antiferroelectric layer 2522 may be formed on the charge trapping layer 251, and the ferroelectric layer 2521 is formed on the antiferroelectric layer 2522. The order of forming the ferroelectric layer 2521 and the antiferroelectric layer 2522 would not influence the object of this disclosure, and may be changed according to practical requirements. That is, the charge trapping layer 251, the antiferroelectric layer 2522 and the ferroelectric layer 2521 may be formed on the first insulating layer 24 in such order, or in the order of the antiferroelectric layer 2522, the ferroelectric layer 2521, and the charge trapping layer 251 being formed on the first insulating layer 24.

In certain aspects, each of the ferroelectric layer 2521, the antiferroelectric layer 2522 and the charge trapping layer 251 has a thickness ranging from 1 nm to 30 nm. In one aspect, the ferroelectric layer 2521 may have a thickness ranging from 3 nm to 20 nm, so as to maintain better ferroelectricity.

Figure 3:
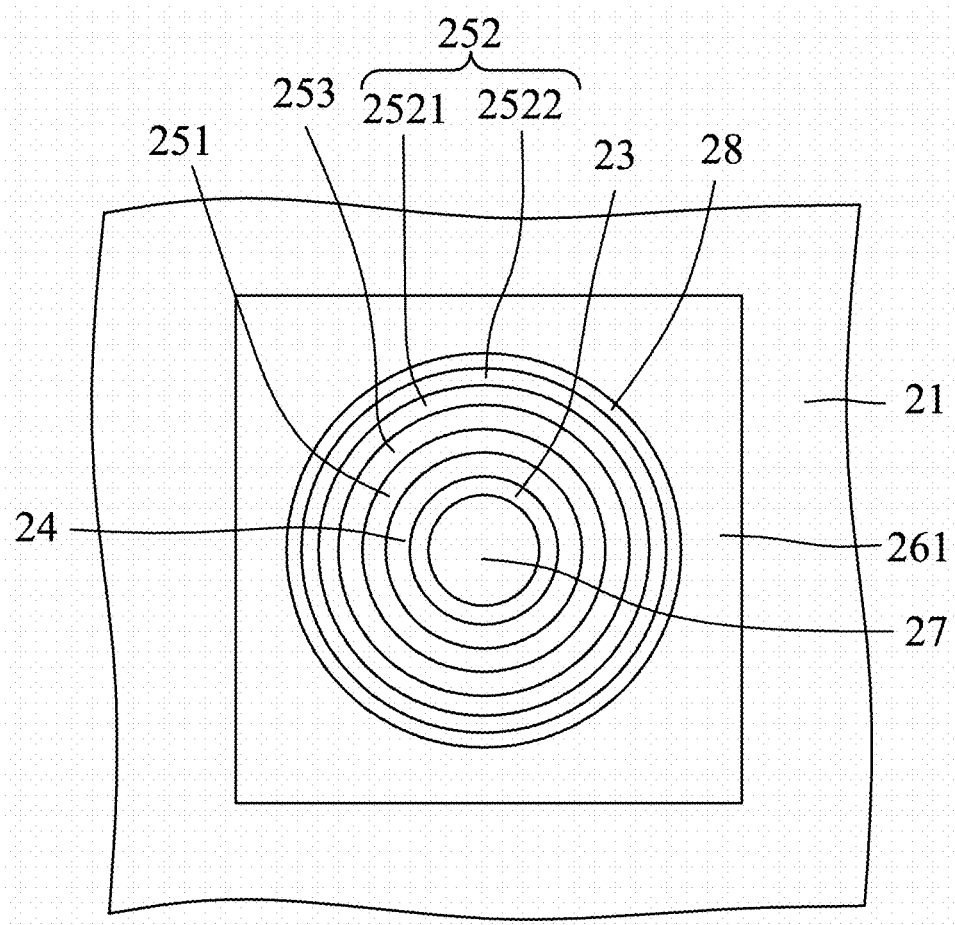
FIG. 3 is a top view illustrating a variation of the vertical field effect transistor of the embodiment.

Referring to FIG. 3, in a variation of the embodiment, the vertical field effect transistor 200 further includes a second insulating layer 28 disposed between the stacked structure 25 and the gate unit 26, and a third insulating layer 253 disposed between the charge trapping layer 251 and the composite element 252, but may optionally include one of these insulting layers 28, 253 according to practical requirements. Each of the second insulating layer 28 and the third insulating layer 253 is made of a dielectric insulating material that may have a non-orthorhombic phase and a high dielectric constant.

Figure 4:
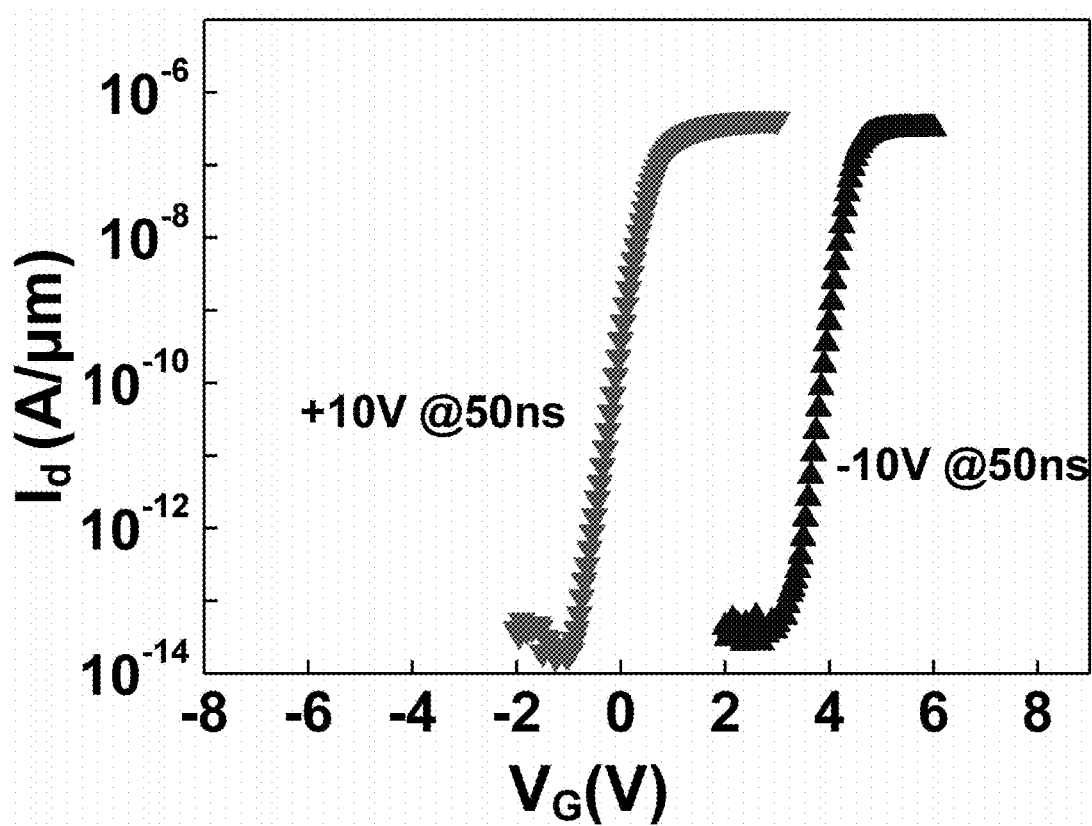
FIG. 4 is a graph showing simulated transfer characteristics of the vertical field effect transistor of the embodiment.
Figure 5:
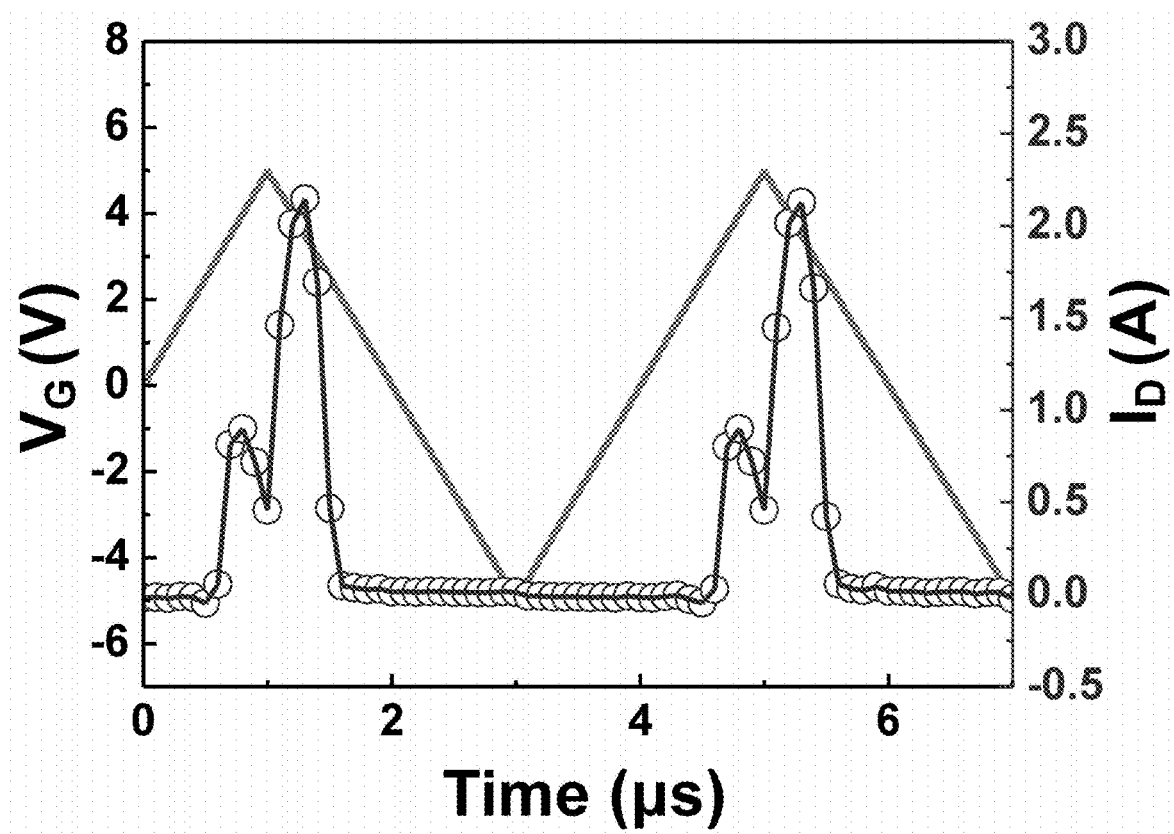
FIG. 5 is a graph showing a pulse response of the vertical field effect transistor of the embodiment.
Figure 6:
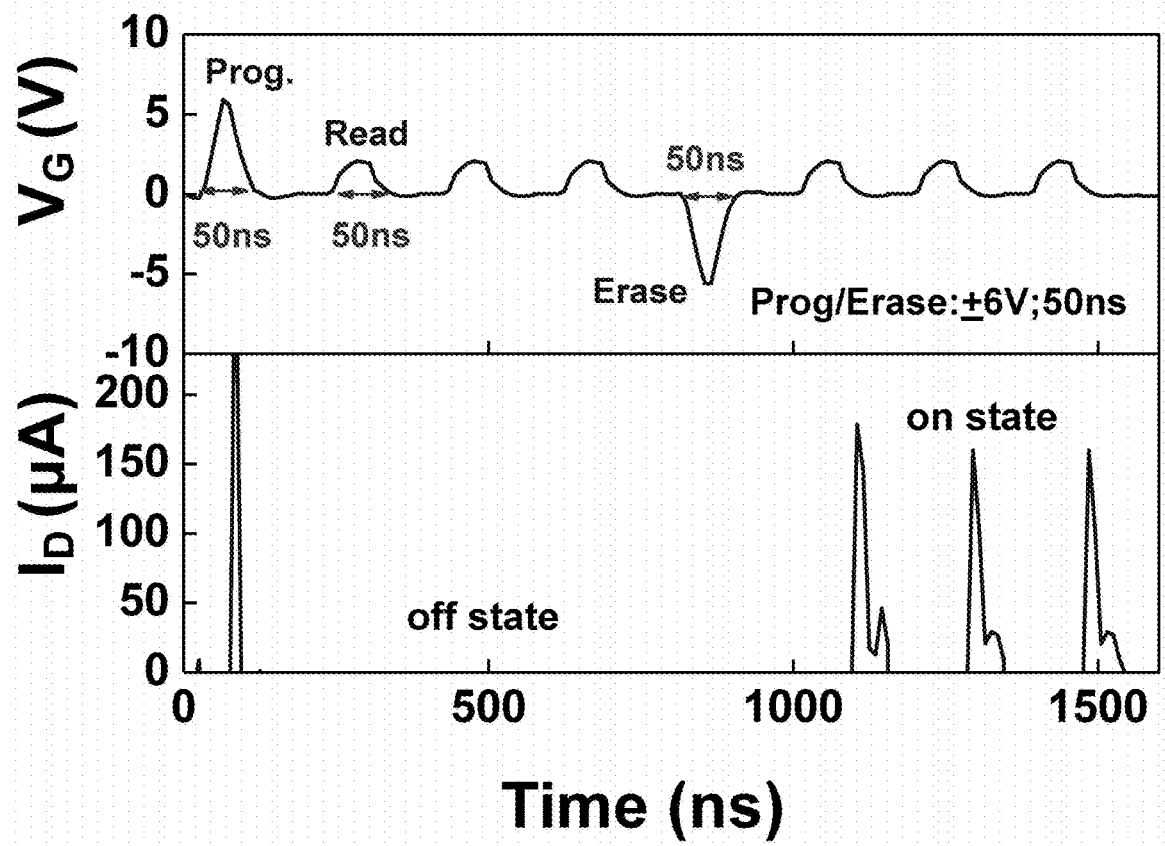
FIG. 6 is a graph showing a pulse sequence during programming, reading and erasing operations of the embodiment.

Referring to FIGS. 4 to 6, these graphs show simulated test results of the storage memory device 2 of this disclosure, which includes the vertical field effect transistor 200 with the stacked structure 25. The semiconductor substrate 21 is made of silicon. The stacked structure 25 includes the antiferroelectric layer that is made of $ZrO_2$ and has a thickness of 10 nm, the ferroelectric layer 2521 that is made of $HfZrO_x$ with Zr being present in an doping amount of 40 mol % and has a thickness of 10 nm, and the charge trapping layer that is made of HfON and has a thickness of 3 nm.

FIG. 4 shows simulated transfer characteristics of the vertical field effect transistor 200 of the storage memory device 2. The simulation result shows that when drain voltage of ±10V is applied for 50 ns during the programming and erasing operations, the storage memory device 2 may exhibit a memory window of more than 2 V.

Further, FIG. 5 shows a simulated result of a pulse response of the vertical field effect transistor 200. The simulation is carried out by applying a triangular wave voltage ($V_G$) to the gate 261 of the vertical field effect transistor 200 with an amplitude of 5 V. The output drain current ($I_D$) of the vertical field effect transistor 200, which is not in a square waveform, is affected by the transient behavior of the composite element 252 of the vertical field effect transistor 200, indicating the existence of ferroelectricity and antiferroelectricity.

Moreover, FIG. 6 shows a pulse sequence during programming, reading and erasing operations of the storage memory device 2. The result shows that when gate voltages of ±6V is applied for 50 ns during the programming and erasing operations, the storage memory device 2 has an operating speed up to 50 ns, which is hundreds of times faster than that of the conventional storage memory device.

In conclusion, the negative capacitance observed in the ferroelectric layer 2521 leads to smaller subthreshold swing of the storage memory device 2, thus reduces the power consumption during switching and off-state current of the vertical field effect transistor 200. In addition, since the antiferroelectric layer 2522 has a larger coercive field, the saturated polarization of the ferroelectric layer 2521 during programming and erasing operations under high electric fields can be maximized. Further, reduction of the electric field across the ferroelectric layer 2521 and the charge trapping layer 251 minimizes the occurrence of failure and leakage current during repeated reading and programming operations. Therefore, the storage memory device 2 of this disclosure has a superior operating speed.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A storage memory device, comprising a vertical field effect transistor including:
   a semiconductor substrate;
   a pillar disposed on said semiconductor substrate and extending away from said semiconductor substrate in an extension direction, said pillar including a source and a drain that are disposed at two opposite end portions of said pillar, and a channel that is disposed between and connected with said source and said drain;
   a first insulating layer surrounding a portion of said channel of said pillar;
   a stacked structure disposed on and surrounding said first insulating layer opposite to said pillar, and including a charge trapping layer and a composite element that has a ferroelectric layer and antiferroelectric layer, said ferroelectric layer being made of a doped hafnium oxide-based material that has a predominantly orthorhombic phase and that exhibits a negative capacitance, said antiferroelectric layer being made of a zirconium oxide-based material that has a predominantly tetragonal phase; and
   a gate unit surrounding a portion of said stacked structure opposite to said first insulating layer, and including at least one gate.

2. The storage memory device of claim 1, wherein said charge trapping layer is made of a material selected from the group consisting of silicon nitride, silicon carbide, a high dielectric constant oxide having a non-orthorhombic phase, and combinations thereof.

3. The storage memory device of claim 2, wherein said high dielectric constant oxide is selected from the group consisting of zirconium oxide, hafnium oxide, aluminum oxide, titanium oxide, tantalum oxide, zirconium oxynitride, hafnium oxynitride, silicon oxynitride, aluminum oxynitride, titanium oxynitride, tantalum oxynitride, hafnium silicon oxide, zirconium silicon oxide, and combinations thereof.

4. The storage memory device of claim 1, wherein said doped hafnium oxide-based material is selected from the group consisting of aluminum (Al)-doped hafnium oxide, silicon (Si)-doped hafnium oxide, strontium (Sr)-doped hafnium oxide, zirconium (Zr)-doped hafnium oxide, lanthanum (La)-doped hafnium oxide, yttrium (Y)-doped hafnium oxide, gadolinium (Gd)-doped hafnium oxide, and combinations thereof.

5. The storage memory device of claim 4, wherein:
   when said doped hafnium oxide-based material is Al-doped hafnium oxide, Al is present in an amount ranging from 2 mol % to 10 mol % based on a total molar amount of said Al-doped hafnium oxide;
   when said doped hafnium oxide-based material is Si-doped hafnium oxide, Si is present in an amount ranging from 2 mol % to 10 mol % based on a total molar amount of said Si-doped hafnium oxide;

when said doped hafnium oxide-based material is Sr-doped hafnium oxide, Sr is present in an amount ranging from 2 mol % to 15 mol % based on a total molar amount of said Sr-doped hafnium oxide;

when said doped hafnium oxide-based material is Zr-doped hafnium oxide, Zr is present in an amount ranging from 1 mol % to 50 mol % based on a total molar amount of said Zr-doped hafnium oxide;

when said doped hafnium oxide-based material is La-doped hafnium oxide, La is present in an amount ranging from 2 mol % to 15 mol % based on a total molar amount of said La-doped hafnium oxide;

when said doped hafnium oxide-based material is Y-doped hafnium oxide, Y is present in an amount ranging from 2 mol % to 15 mol % based on a total molar amount of said Y-doped hafnium oxide; and when said doped hafnium oxide-based material is Gd-doped hafnium oxide, Gd is present in an amount ranging from 2 mol % to 15 mol % based on a total molar amount of said Gd-doped hafnium oxide.

6. The storage memory device of claim 1, wherein said zirconium oxide-based material includes one of undoped zirconium oxide, doped zirconium oxide, and the combination thereof.

7. The storage memory device of claim 6, wherein said zirconium oxide-based material includes at least one of doped zirconium oxide that is zirconium oxide doped with a dopant, said dopant being selected from the group consisting of silicon, aluminum, germanium, yttrium, hafnium and nitrogen, and being present in an amount greater than 0 mol % and not greater than 50 mol % based on a total molar amount of said doped zirconium oxide.

8. The storage memory device of claim 1, wherein each of said ferroelectric layer, said antiferroelectric layer and said charge trapping layer has a thickness ranging from 1 nm to 30 nm.

9. The storage memory device of claim 1, wherein said vertical field effect transistor further includes a second insulating layer disposed between said stacked structure and said gate unit.

10. The storage memory device of claim 9, wherein said second insulating layer is made of a dielectric insulating material having a non-orthorhombic phase.

11. The storage memory device of claim 1, wherein said stacked structure further includes a third insulating layer disposed between said charge trapping layer and said composite element.

12. The storage memory device of claim 11, wherein said third insulating layer is made of a dielectric insulating material having a non-orthorhombic phase.

13. The storage memory device of claim 1, wherein said gate is made of one of a conductor material and a semiconductor material.

14. The storage memory device of claim 1, wherein said vertical field effect transistor further includes an insulating body that is disposed on said semiconductor substrate, said pillar surrounding and formed on said insulating body.

15. The storage memory device of claim 1, wherein said gate unit includes a plurality of gates and a plurality of gate insulators which are alternately stacked along said extension direction.

* * * * *